United States Patent
Yoneu

(10) Patent No.: US 7,508,897 B2
(45) Date of Patent: Mar. 24, 2009

(54) PLL CIRCUIT AND HIGH-FREQUENCY RECEIVING DEVICE

(75) Inventor: Yuki Yoneu, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 533 days.

(21) Appl. No.: 11/151,397

(22) Filed: Jun. 14, 2005

(65) Prior Publication Data

US 2005/0277386 A1    Dec. 15, 2005

(30) Foreign Application Priority Data

Jun. 15, 2004    (JP) .............................. 2004-177472

(51) Int. Cl.
*H03D 3/24*    (2006.01)

(52) U.S. Cl. ................. 375/376; 375/297; 375/374; 331/14; 331/16; 455/264; 455/76

(58) Field of Classification Search ................. 375/374, 375/376, 297; 455/76, 264; 331/14, 16, 331/2

See application file for complete search history.

(56) References Cited

U.S. PATENT DOCUMENTS

| | | | | |
|---|---|---|---|---|
| 6,078,633 | A * | 6/2000 | Shiotsu et al. | 375/374 |
| 7,003,065 | B2 * | 2/2006 | Homol et al. | 375/376 |
| 2003/0026372 | A1 * | 2/2003 | Boerstler et al. | 375/376 |
| 2005/0078768 | A1 * | 4/2005 | Sun et al. | 375/297 |
| 2005/0125707 | A1 * | 6/2005 | Bonaccio et al. | 713/502 |
| 2006/0003720 | A1 * | 1/2006 | Lee et al. | 455/264 |

FOREIGN PATENT DOCUMENTS

| | | |
|---|---|---|
| JP | 61-75639 U | 5/1986 |
| JP | 5-284021 A | 10/1993 |
| JP | 8-102668 A | 4/1996 |
| JP | 0755120 A1 | 1/1997 |
| JP | 9-93125 A | 4/1997 |
| JP | 2000-30749 A | 11/2000 |
| JP | 2001-285061 A | 10/2001 |
| JP | 2002-176591 A | 6/2002 |
| JP | 2003-318732 A | 11/2003 |
| JP | 2004-527936 A | 9/2004 |
| WO | WO-02/060064 A2 | 8/2002 |

* cited by examiner

*Primary Examiner*—Chieh M Fan
*Assistant Examiner*—Eva Puente
(74) *Attorney, Agent, or Firm*—Birch, Stewart, Kolasch & Birch, LLP

(57) ABSTRACT

A PLL circuit has (i) a counter which divides a frequency of a VCO output whose frequency has been divided by a frequency divider and (ii) a memory which stores plural patterns of set cycles of the counter. The memory reads out one of the set cycles designated by a selection signal inputted through a serial bus (SB) from an outside of the PLL circuit. The set cycle, read out from the memory, which has a large amount of data, is inputted through a parallel bus (PB) into the counter, so that it hardly takes time to set a cycle for the counter. Further, even when the number of bits of the counter increases, the setting time is not lengthened.

31 Claims, 10 Drawing Sheets

PLL CIRCUIT AND HIGH-FREQUENCY RECEIVING DEVICE

This Nonprovisional application claims priority under 35 U.S.C. § 119(a) on Patent Application No. 2004/177472 filed in Japan on Jun. 15, 2004, the entire contents of which are hereby incorporated by reference.

FIELD OF THE INVENTION

The present invention relates to a PLL (phase-locked loop) circuit included in a high-frequency receiving device which receives digital television broadcasting and the like.

BACKGROUND OF THE INVENTION

In digital television broadcasting, a high-frequency receiving device which demodulates a high-frequency signal into I and Q quadrature baseband signals is required in receiving a high-frequency signal (quadrature digital modulation signal) transmitted from a broadcasting station.

FIG. 8 illustrates a general arrangement of a high-frequency receiving device 101 which demodulates a high-frequency signal into I and Q quadrature baseband signals.

In the high-frequency receiving device 101, first, a high-frequency signal transmitted from a broadcasting station is inputted through an input terminal 102 and amplified in a gain variable high-frequency amplifier 103. A frequency of the amplified high-frequency signal is converted in mixer circuits 108 and 109 so as to detect I and Q quadrature baseband signals. The mixer circuit 108 demodulates the high-frequency signal into an I baseband signal by using a 0° signal outputted from a 90° phase shifter 107. Meanwhile, the mixer circuit 109 demodulates the high-frequency signal into a Q baseband signal by using a 90° phase-shifted signal outputted from the 90° phase shifter 107. Each of the two mixer circuits 108 and 109 demodulates the received high-frequency signal into each quadrature baseband signal.

An output of the mixer circuit 108 is amplified in a gain variable baseband amplifier 110. Then, a frequency component out of a desired band is blocked by a low-pass filter 112. Furthermore, an output of the low-pass filter 112 is amplified by an amplifier 114 and outputted as a baseband output (I) from a baseband output terminal 116. Similarly, an output of the mixer circuit 109 is amplified in a gain variable baseband amplifier 111. Then, a frequency component out of a desired band is blocked by a low-pass filter 113. Furthermore, an output of the low-pass filter 113 is amplified by an amplifier 115 and outputted as a baseband output (Q) from a baseband output terminal 117.

A voltage-control local oscillator (VCO) 104, in order to convert a frequency of a high-frequency signal into a frequency of a baseband signal, outputs to the 90° phase shifter 107 a local signal whose frequency is controlled by a control voltage. A local oscillator 105 generates a frequency signal serving as a reference of the local signal.

A PLL circuit 106, based on the frequency signal generated in the local oscillator 105, performs feedback control so that the local signal converges at a value in accordance with a set cycle. The 90° phase shifter 107 generates a 90° phase-shifted signal and outputs the 90° phase-shifted signal and a 0° signal. The 90° phase-shifted signal is a signal whose phase is shifted by 90° from that of the local signal. The 0° phase-shifted signal is a signal whose phase is not shifted at all from that of the local signal.

FIG. 9 illustrates an example arrangement of a general PPL circuit used as the PLL circuit 106. The PLL circuit is for example a circuit disclosed in Document 1: Japanese Laid-Open Publication No. 318732/2003 (Tokukai 2003-318732; published on Nov. 7, 2003: Corresponding U.S. patent Publication 2003/0203720A1; published on Oct. 30, 2003).

The PLL circuit 106 illustrated in FIG. 9 includes frequency dividers 118 and 119, counters 120 and 121, a phase comparator 122, a current source 123, and a low-pass filter (LPF) 124.

An output signal of the local oscillator 105 is divided by the frequency divider 118 at a fixed frequency-dividing ratio. Further, an output signal of the VCO 104 is divided at a fixed frequency-dividing ratio by the frequency divider 119 equivalent to a prescaler. The counters 120 and 121 further divide the frequency-divided signals by counting up (or counting down) the frequency-divided signals. The counter 120 is a functional equivalent of a fixed frequency divider in the PLL circuit of Document 1. Further, since it is possible to divide an output signal of the local oscillator 105 with the counter 120 alone, the frequency divider 119 may be omitted. A cycle (frequency-dividing cycle) of the counter 121 is set by a set cycle inputted from outside. Since the set cycle has a value in accordance with a channel frequency, a frequency of a signal counted by the counter 121 is divided in accordance with the channel frequency.

Note that although a cycle of the counter 20 is also usually set, the process is omitted here. Each of the counters 120 and 121 outputs a signal every time a single cycle is counted. The phase comparator 122 outputs a phase difference between the counters 120 and 121. The current source 123 outputs a predetermined current at a time in accordance with the output (phase difference) of the phase comparator 122. The LPF 124 has a capacitor. The capacitor is charged and discharged by the output current from the current source 123, so that the current is converted into a voltage. The voltage becomes a control signal of the VCO 104. The control signal is used to perform feedback control.

Further, as disclosed in Document 2: Japanese Laid-Open Publication No. 307459/2000 (Tokukai 2000-307459; published on Nov. 2, 2000), the set cycle of the counter 121 is usually inputted through a serial bus (data signal line) into the PLL circuit 106.

In order to receive a high-frequency signal, it is necessary to input a set cycle in accordance with the high-frequency signal into a counter in the PLL circuit 106. However, since the set cycle is usually inputted through a serial bus, there is such a problem that it takes time to set a cycle.

For example, as illustrated in FIG. 10, when a cycle of the 24-bit counter 121 is set by using an I²C bus serving as a typical serial bus, it takes approximately 7 msec (millisecond) under such a condition that the I²C bus is operated at 400 kHz. Moreover, when the number of bits of the counter 121 increases, the setting time is lengthened proportionately.

SUMMARY OF THE INVENTION

The present invention has as an object to shorten time required in setting a cycle in a PLL circuit having a frequency-dividing counter whose count cycle is set at a cycle given from outside through a serial bus.

In order to solve the foregoing problems, a PLL circuit according to the present invention includes: a counter, being programmable, which divides a frequency of an input signal; a memory for storing plural patterns of set cycles of the counter; a serial bus for transmitting, to the memory, data for selecting one of the set cycles stored in the memory; and a parallel bus for transmitting, to the counter, the set cycle read out from the memory based on the data.

In the foregoing arrangement, a set cycle having a large amount of data is supplied from the memory thorough the parallel bus to the counter. For this reason, it hardly takes time to set a cycle for the counter, and the setting time is not lengthened even when the number of bits of the counter increases. Furthermore, in case of using the PLL circuit for a high-frequency receiving device, even when data for selecting a set cycle is supplied to the memory through the serial bus in a region where a reception channel is determined, it will not take long time to set a cycle for the counter since the data is of a small amount.

In order to solve the foregoing problems, another PLL circuit according to the present invention includes: a counter, being programmable, which divides a frequency of an input signal; a memory for storing plural patterns of set cycles of the counter; an external setting line for transmitting the set cycles from outside; a selection circuit for selecting one of the set cycles read out from the memory or one of the set cycles from the external setting line; a serial bus for transmitting selection data to the selection circuit; and a parallel bus for transmitting, to the counter, the set cycle outputted from the selection circuit.

In the PLL circuit, unlike the preceding PLL circuit, the selection circuit selects and outputs either a set cycle read out from the memory or a set cycle transmitted from the external setting line. A set cycle having a large amount of data is supplied from the selection circuit through the parallel bus to the counter. For this reason, as with the preceding PLL circuit, it hardly takes time to set a cycle for the counter, and the setting time is not lengthened even when the number of bits of the counter increases. Further, since the external setting line and the selection circuit are provided, it is possible to select the more convenient one of a value from the external setting line and a value from the memory depending on a situation.

A high-frequency receiving device has either one of the PLL circuits in order to set a reception frequency. This makes it possible to provide a high-frequency receiving device which requires short time for reception.

Thus, in each of the two PLL circuits and the high-frequency receiving device according to the present invention, whereas the serial bus is used to transmit data for selecting a cycle for the memory, the parallel bus is used to transmit the selected set cycle from the memory to the counter, so that the set cycle can be transmitted in a short period of time.

In practical use, a frequency of a receiver signal is determined for each channel, and a set cycle to be inputted does not need to encompass all counter values. Therefore, whereas it has been conventionally necessary that data equivalent to the number of bits of a counter be transmitted through a serial bus, several patterns of set cycles are prestored in the memory and one of them is selected according to a channel, so that only several bits (see FIG. 2) are sufficient. This makes it possible to shorten time required in setting a cycle for the counter. Further, the setting time is not lengthened even when the number of bits of the counter increases. Therefore, time required in reception can be shortened.

For a fuller understanding of the nature and advantages of the invention, reference should be made to the ensuing detailed description taken in conjunction with the accompanying drawings.

DESCRIPTION OF THE EMBODIMENTS

Embodiments of the present invention will be described below with reference to FIGS. 1 to 7.

First Embodiment

Figure 1:
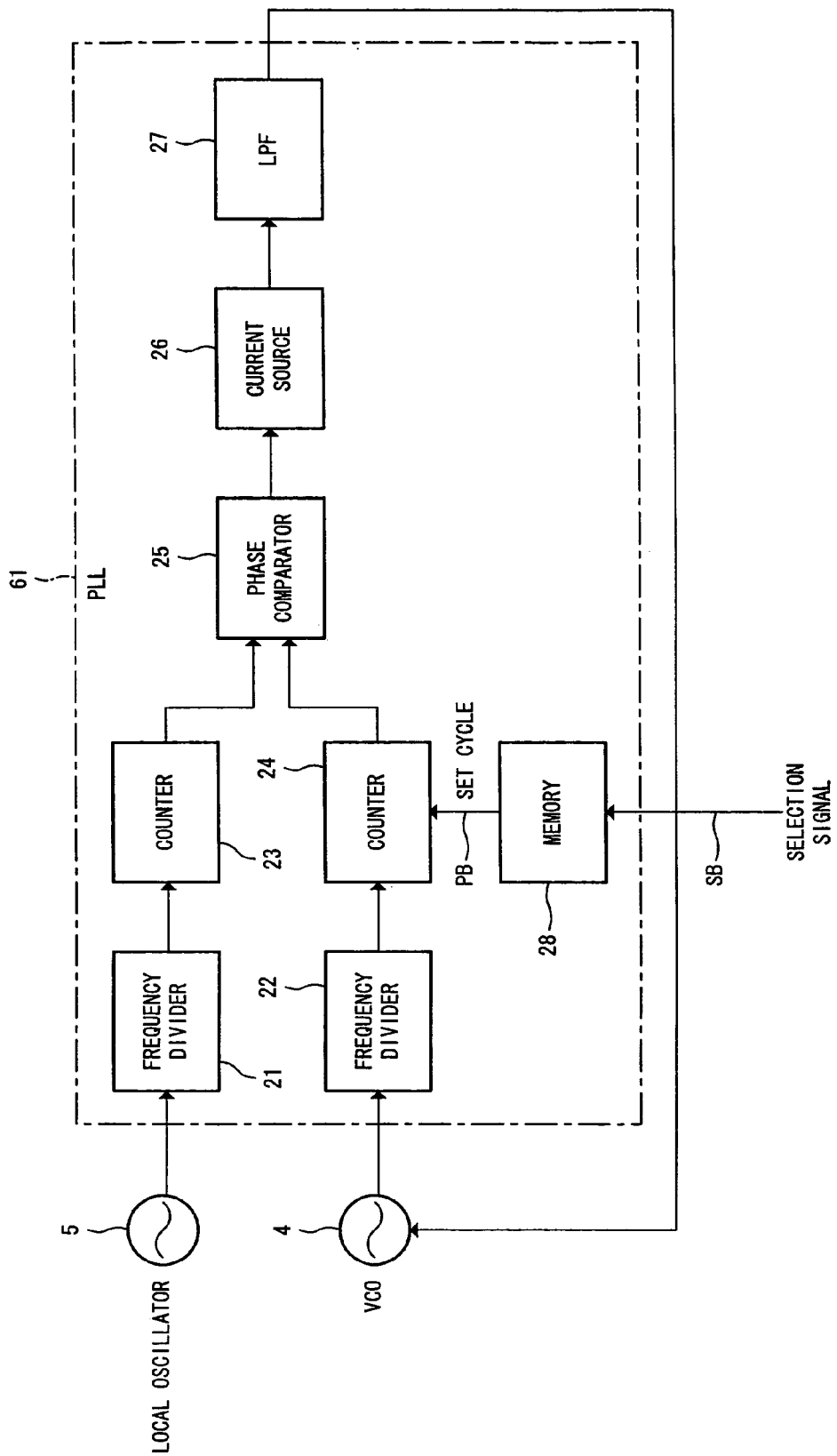
FIG. 1 is a circuit block diagram illustrating an example arrangement of a PLL circuit of a First Embodiment.

FIG. 1 is a block diagram illustrating an arrangement of a PLL circuit 61 according to the present embodiment.

As illustrated in FIG. 1, the PLL circuit 61 has frequency dividers 21 and 22, counters 23 and 24, a phase comparator 25, a current source 26, a low-pass filter (LPF) 27, and a memory 28.

The frequency divider 21 divides at a predetermined frequency-dividing ratio a frequency signal, outputted from a local oscillator 5, which serves as a reference of a local signal outputted by a voltage-control local oscillator (VCO) 4. The frequency divider 22 divides at a predetermined frequency-dividing ratio an output signal from the voltage-control local oscillator (VCO) 4. In order to make it easy for the counters 23 and 24 to count, the frequency divider 22 functions as a prescaler which divides in advance an output of the high-frequency local oscillator 5 and an output of the VCO 4.

The counter 23 counts down (or counts up) the frequency-divided signal divided by the frequency divider 21 so as to divide the frequency-divided signal. Since a frequency signal from the local oscillator 5 can be divided as desired with the counter 23 alone, the frequency divider 21 can be omitted in such a case.

The counter 24 counts down (or counts up) the frequency-divided signal divided by the frequency divider 22 so as to divide the frequency-divided signal. The counter 24 is a programmable counter whose count cycle can be set in accordance with a set cycle supplied from outside. The set cycle is set at such a value that a frequency of a received signal is divided into frequencies each of which corresponds to each channel, and the set cycle is prepared for each channel frequency. The set cycle is supplied from the memory 28 as described later. The counter 24 counts an input signal at a changeable cycle so as to divide a frequency of the input signal in accordance with the channel frequency.

The phase comparator 25 compares the phase of an output signal of the counter 23 with that of an output signal of the counter 24 so as to detect a difference therebetween. Specifically, the phase comparator 25 detects a rising edge of an output signal of each of the counters 23 and 24 and outputs a pulse signal having a width proportional to a phase difference.

The current source 26 is a circuit which outputs a current of a predetermined value for a period in accordance with the width (phase difference) of the pulse signal from the phase comparator 25.

The LPF 27 has a capacitor in an input side thereof. The capacitor is charged and discharged by a current outputted from the current source 26 for a time in accordance with the phase difference, so that a terminal voltage of the capacitor is outputted as a voltage in accordance with the phase difference. The output voltage of the LPF 27 is supplied as a control voltage to the VCO 4.

The memory 28 stores plural patterns of set cycles of the counter 24. Further, the memory 28 reads out (selects) that one of the set cycles which is designated by a selection signal (address signal) inputted from the outside of the PLL circuit 61 through a serial bus SB. The memory 28 is connected to the counter 24 by a parallel bus PB. The set cycle read out from the memory 28 is inputted through the parallel bus into the counter 24.

In the PLL circuit 61 as arranged above, an output signal of the local oscillator 5 is divided at a fixed frequency-dividing ratio by the frequency divider 21, and is further divided by the counter 23, and is outputted to the phase comparator 25. Further, an output signal of the VCO 4 is divided at a fixed frequency-dividing ratio by the frequency-divider 22, and is further divided at a set cycle by the counter 24, and is outputted to the phase comparator 25. At this time, the set cycle supplied to the counter 24 is selected and read out in the memory 28 by a selection signal in accordance with a channel.

The phase comparator 25 outputs a signal whose pulse width is proportional to a phase difference between the two input signals, and the current source 26 outputs a constant current for a period of time corresponding to the pulse width. The LPF 27 charges and discharges the current with the capacitor in the input side, so that a voltage in accordance with a period of charging and discharging (phase difference) is generated. The voltage is supplied as a control voltage to the VCO 4, so that the VCO 4 outputs a local signal whose frequency is controlled in accordance with the control voltage.

Here, the counter 24 is given a set cycle having a large amount of data through the parallel bus PB from the memory 28. For this reason, it hardly takes time to set a cycle for the counter 24. Further, the setting time is not lengthened even when the number of bits of the counter 24 increases. Furthermore, in a region where a reception channel is determined, even when an interface of a conventional serial bus is used, a selection signal having a small amount of data for selecting a set cycle stored in the memory 28 can be transmitted to shorten time required in setting a cycle for the counter 24.

Figure 2:
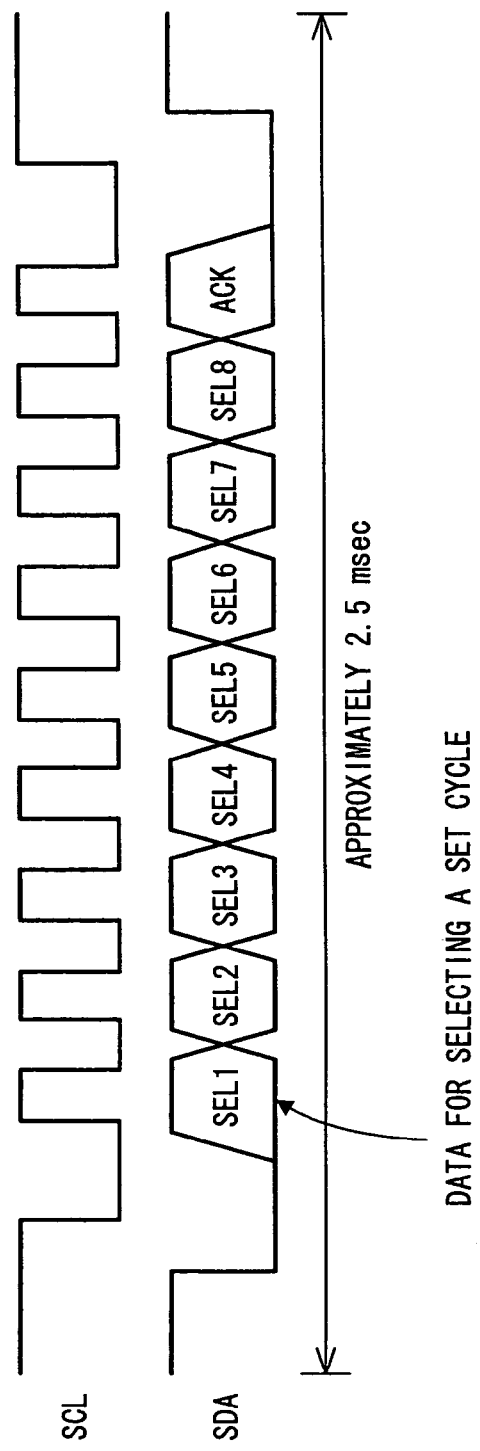
FIG. 2 illustrates a clock and cycle setting data transferred via a serial bus in the PLL circuit of the First Embodiment.

In practical use, a frequency of a receiver signal is determined for each channel, and a set cycle to be inputted into the counter 24 does not need to encompass all counter values. Therefore, whereas it has been conventionally necessary that data equivalent to the number of bits of a counter be transmitted through a serial bus, several patterns of set cycles are prestored in the memory 28 and one of them is selected according to a channel, so that only several bits are sufficient as illustrated in FIG. 2. This makes it possible to shorten time required in setting a counter cycle. Therefore, time required in reception is also shortened.

Note in FIG. 2 that eight patterns of cycle selection data SDA (SEL1 to SEL8) are supplied to the memory 28 at a timing of a clock SCL supplied from a CPU and the like (not shown). Further, the serial bus SB for example includes an I²C bus and transmits the clock SCL together with the cycle selection data SDA.

Second Embodiment

Figure 3:
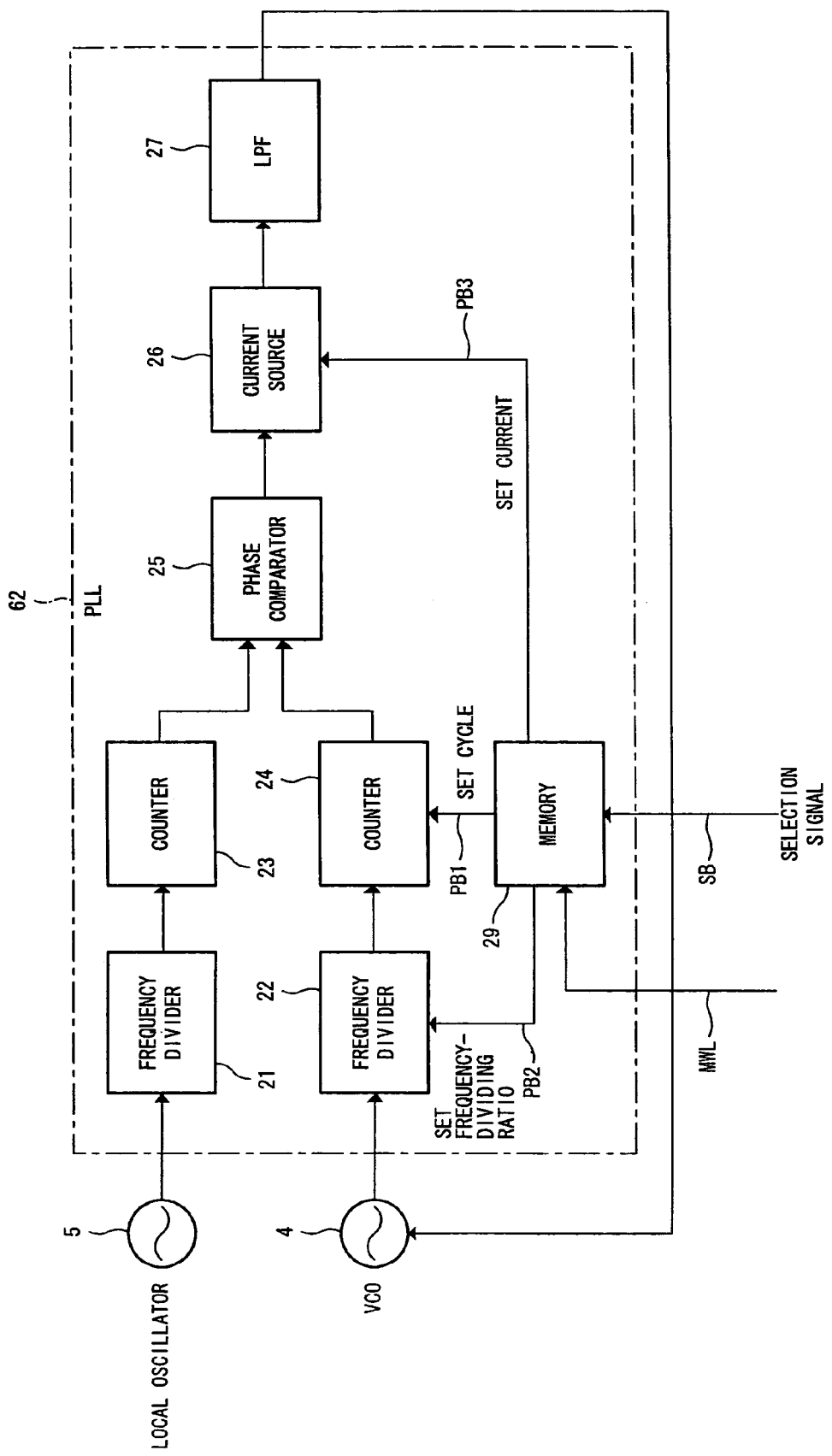
FIG. 3 is a circuit block diagram illustrating an example arrangement of a PLL circuit of a Second Embodiment.

FIG. 3 is a block diagram illustrating an arrangement of a PLL circuit 62 according to the present embodiment.

As illustrated in FIG. 3, the PLL circuit 62, as with the PLL circuit 61 described above, has frequency dividers 21 and 22, counters 23 and 24, a phase comparator 25, a current source 26, a low-pass filter (LPF) 27. However, the PLL circuit 62 has a memory 29 instead of a memory 28.

Further, unlike the frequency divider 22 of the PLL circuit 61, the frequency divider 22 sets a frequency-dividing ratio and divides an output frequency of a VCO 4 at thus set frequency-dividing ratio. In case of changing a frequency accuracy in the PLL circuit 62, the frequency-dividing ratio setting of the frequency divider 22 is changed.

Moreover, unlike the current source 26 of the PLL circuit 61, the current source 26 selects and sets a plurality of current values (e.g., 2 mA and 4 mA) and outputs a current of a set current value. By changing a current value of the current source 26, shortening of a drawing time is preferentially performed or noise reduction is preferentially performed. For this purpose, the current source 26 has (i) a plurality of current source circuits serving as current mirror circuits and (ii) a switch for selecting one of the current mirror circuits for use. When the current source 26 is given set current value data stored in the memory 29 as described later, the current source 26 operates the switch in accordance with the set current value so as to set a current value.

The memory 29, as with the memory 28, stores plural patterns of set cycles of the counter 24. As well, the memory 29 stores as many frequency-dividing ratios of the frequency divider 22 as set current values of the current source 26 in association with the set cycles. The memory 29 is connected to the counter 24 by a parallel bus PB1, and one of the set cycles is read out from the memory 29 and inputted through the parallel bus PB1 into the counter 24. Further, the memory 29 is connected to the frequency divider 22 by a parallel bus PB2 (frequency-dividing parallel bus), and one of the set frequency-dividing ratios is read out from the memory 29 and inputted through the parallel bus PB2 into the frequency-divider 22. Moreover, the memory 29 is connected to the current source 26 by a parallel bus PB3 (current parallel bus), and one of the set current values is read out from the memory 29 and inputted through the parallel bus PB3 into the current source 26. Table 1 shows an example pattern of cycle setting of the counter 24, frequency-dividing ratio setting of the frequency divider 22, and current setting of the current source 26.

TABLE 1

|  | Cycle Setting | Frequency-dividing Ratio Setting | Current Setting |
|---|---|---|---|
| Pattern 1 | 900 | 1/8 | 2 mA |
| Pattern 2 | 500 | 1/16 | 2 mA |
| Pattern 3 | 505 | 1/16 | 4 mA |
| Pattern 4 | 510 | 1/16 | 4 mA |
| Pattern 5 | 520 | 1/16 | 4 mA |
| Pattern 6 | 530 | 1/16 | 4 mA |
| Pattern 7 | 540 | 1/16 | 4 mA |
| Pattern 8 | 275 | 1/32 | 4 mA |

One of the patterns is selected using the serial bus.

In the PLL circuit 62 as arranged above, a selection signal is supplied through the serial bus SB to the memory 29. This causes a setting pattern identified by the selection signal to be selected, so that the set cycle of the counter 24, the set frequency-dividing ratio of the frequency divider 22, and the set current value of the current source 26 are read out simultaneously from the memory 29. For example, in Pattern 1 of Table 1, when a cycle of the counter 24 is set at a 24-bit cycle, a frequency to be locked is determined in the PLL circuit 62 as follows.

First, one comparative signal frequency (output frequency of the counter 24) is determined by the following formula:

$$f\,\text{ref1}=f\,lo/(P1\times B1).$$

Here, P1 is a frequency-dividing ratio of the frequency divider 22, and B1 is a set cycle of the counter 24, and f lo is a frequency of the VCO 4.

Further, it being assumed that f lo=1800 MHz, and P1=8, and f ref1=0.25 MHz, it is concluded from 0.25 MHz=1800 that MHZ/(8×B1) B1=900, so that the set cycle of the counter 24 is 900. The counter 24 outputs a single pulse every time 900 pulses of an output signal of the frequency divider 22 are counted. Therefore, a frequency of the output signal of the frequency divider 22 is divided into 1/900.

Further, the other comparative signal frequency (output frequency of the counter 23) f ref2 is determined by the following formula:

$$f\,\text{ref2}=f\,osc/(P2\times B2).$$

Here, f osc is an oscillatory frequency of the local oscillator 5, and P2 is a frequency-dividing ratio of the frequency divider 21, and B2 is a set cycle of the counter 23.

Further, it being assumed that f ref2=0.25 Mha, and P2=1, and f osc=4 MHz, it is concluded from 0.25 MHz=4 MHz/ (1×B2) that B2=8, so that the set cycle of the counter 23 is 8.

The PLL circuit 62 is provided with a memory writing line MWL for supplying a set cycle to be rewritten in the memory 29. This makes it possible to freely rewrite from outside a value in the memory 29.

Figure 4:
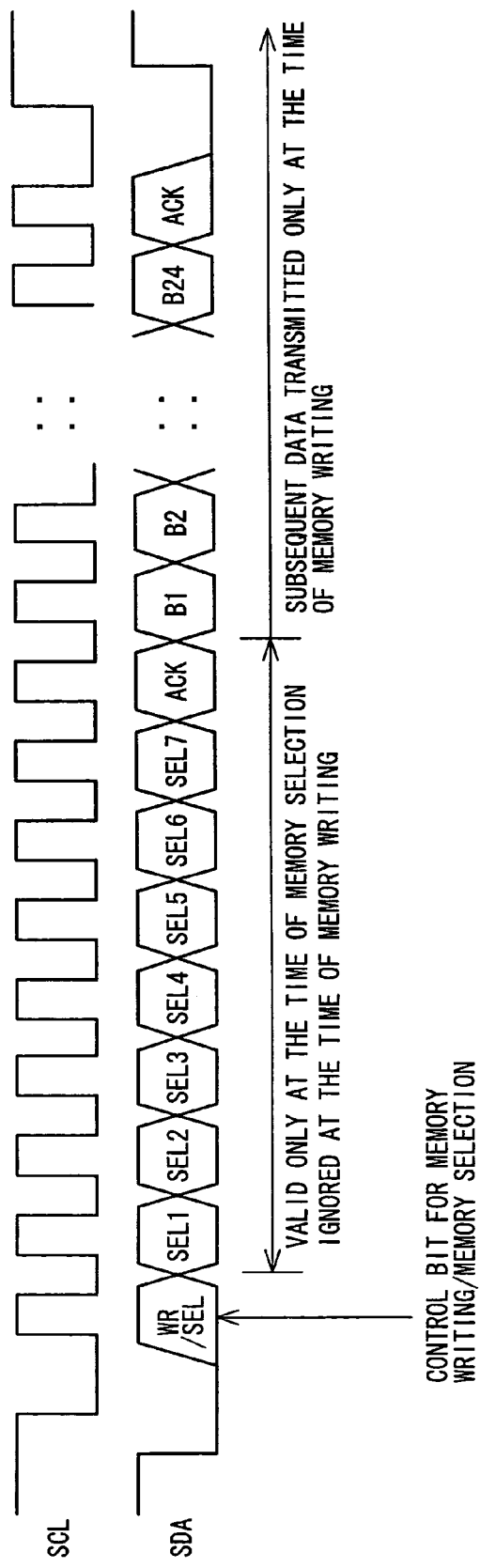
FIG. 4 illustrates a clock and cycle setting data transferred via a serial bus in the PLL circuit of the Second Embodiment.

Further, as illustrated in FIG. 4, a selection signal (cycle selection data SDA) may be provided with a control bit for switching memory writing (a memory writing mode) and memory selection (a memory selection mode). For this reason, for example, when the control bit is "0" the memory writing line MWL is valid (the serial bus SB is invalid), and when the control bit is "1", the serial bus SB is valid (the memory writing line MWL is invalid). Specifically, each of the modes becomes valid at the control bit and continues to be valid until I²C bus communication check data ACK provided in the end of data of the mode is recognized in the selection circuit 30. Therefore, the memory writing line MWL and the serial bus SB can be combined to form a common signal line.

Note that when the memory writing line MWL and the serial bus SB are combined, it takes time to write a set cycle in the memory 29 due to the use of the serial bus SB, but since rewriting is performed with respect to the memory 29 except at a time of reception, operation of the PLL circuit 62 is not affected even when it takes time.

Third Embodiment

Figure 5:
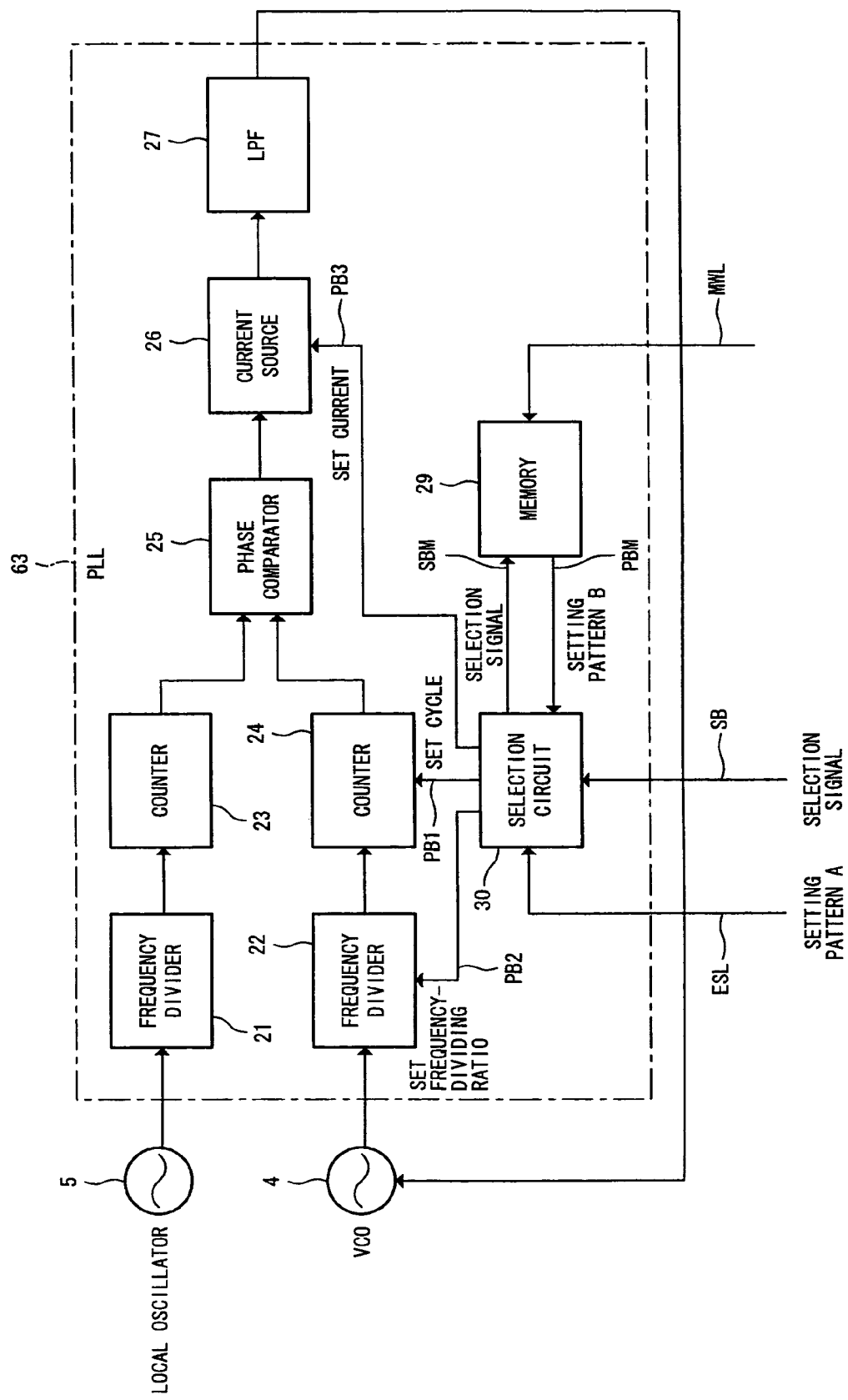
FIG. 5 is a circuit block diagram illustrating an example arrangement of a PLL circuit of the Second Embodiment.

FIG. 5 is a block diagram illustrating an arrangement of a PLL circuit 63 according to the present embodiment.

As illustrated in FIG. 5, the PLL circuit 63, as with the PLL circuit 61, has frequency dividers 21 and 22, counters 23 and 24, a phase comparator 25, a current source 26, a low-pass filter (LPF) 27, a memory 29, and a selection circuit 30.

The selection circuit 30 selects, based on a selection signal supplied through a serial bus SB, either a setting pattern A inputted from outside through an external setting line ESL or a setting pattern B read out from the memory 29. The selection circuit 30 makes it possible to select a convenient set cycle depending on a situation. Such a situation is for example a situation where an external setting line ESL is used to operate the PLL circuit 63 at a value not stored in the memory 29 in the short run for testing and adjustment, and the memory 29 is used at normal times.

Further, the selection signal is transmitted from the selection circuit 30 to the memory 29 through a serial bus SBM, and the setting pattern B is transmitted from the memory 29 to the selection circuit 30 through a parallel bus PBM. Moreover, as with the transmission of the set values from the memory 29 in the Second Embodiment, the set frequency-dividing ratio is transmitted from the selection circuit 30 to the frequency divider 22 through a parallel bus PB1, and the set cycle is transmitted from the selection circuit 30 to the counter 24 through a serial bus PB2, and the set current value is transmitted from the selection circuit 30 to the current source 26 through a serial bus PB3.

When the memory 29 is selected, a selection signal is supplied through the selection circuit 30 to the memory 29. The selection signal includes data for selecting a setting pattern from a plurality of setting patterns stored in the memory 29. This causes the memory 29 to output a setting pattern designated as the setting pattern B.

Figure 6:
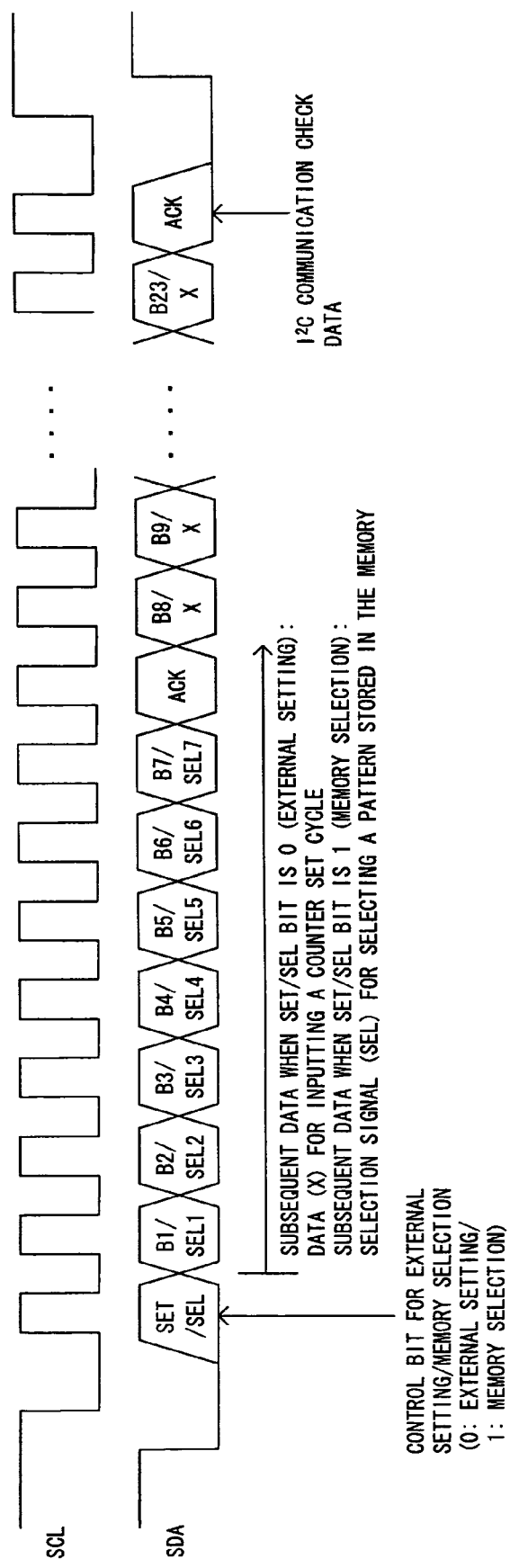
FIG. 6 illustrates a clock and cycle setting data transferred via a serial bus in the PLL circuit of a Third Embodiment.

Further, as illustrated in FIG. 6, a selection signal (cycle selection data SDA) may be provided with a control bit (SET/ SEL bit) for switching external setting line selection (an external setting mode) and memory selection (a memory setting mode). For this reason, for example, when the control bit is "0", the external setting line ESL is valid (the serial bus SBM is invalid), and data after the control bit is data B8/X to B23/X of the setting pattern A from outside. Meanwhile, when the control bit is a "1", the serial bus SBM is valid (the external setting line ESL is invalid), and data after the control bit serves as data B1/SEL1 to B7/SEL7 for selecting a setting pattern serving as the setting pattern B stored in the memory 29. Specifically, each of the modes becomes valid at the control bit and continues to be valid until I²C bus communication check data ACK provided in the end of data of the mode is recognized in the selection circuit 30. Therefore, the external setting line ESL and the serial bus SB can be combined to form a common signal line.

Fourth Embodiment

Figure 7:
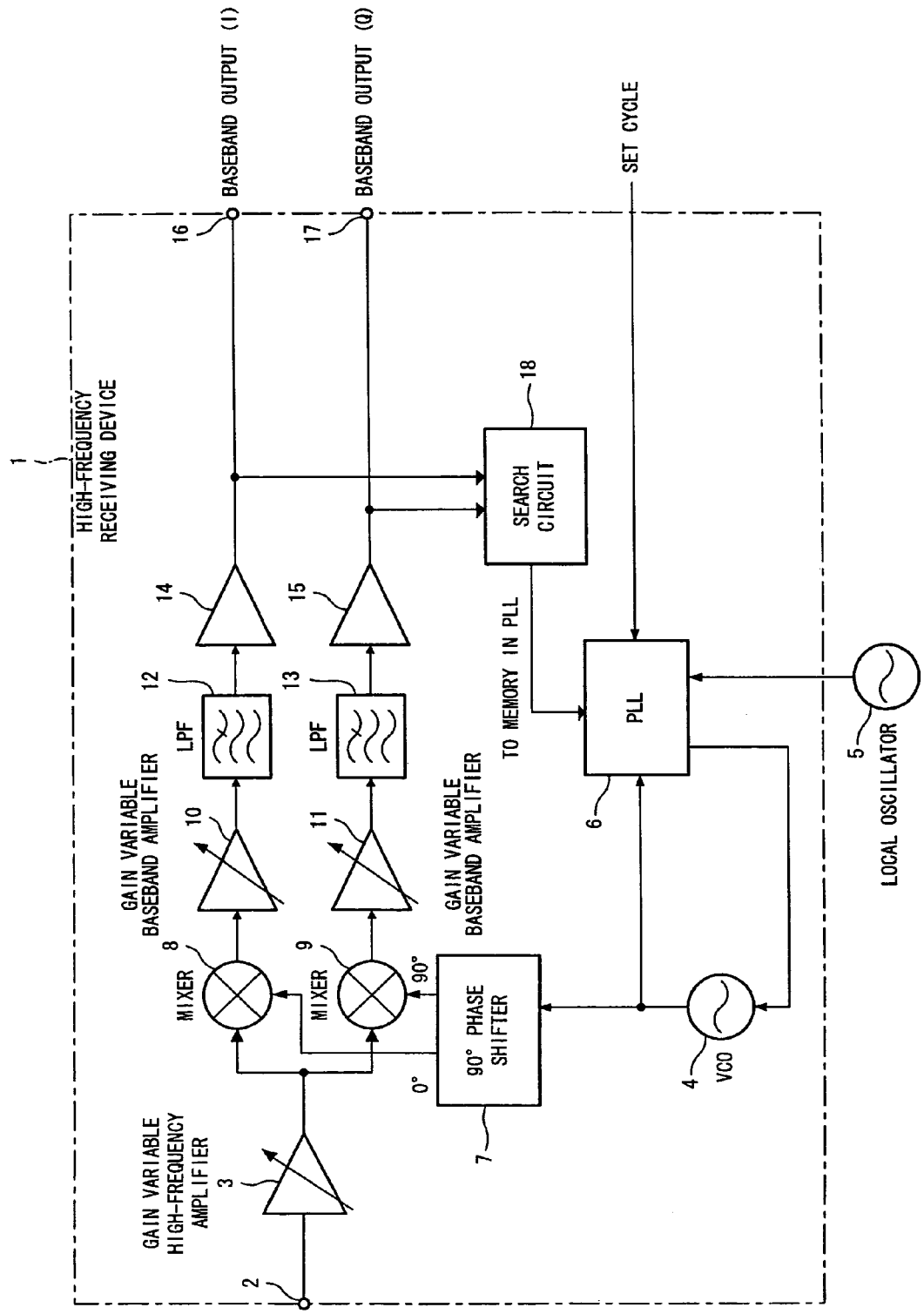
FIG. 7 is a circuit block diagram illustrating an example arrangement of a high-frequency receiving device of a Fourth Embodiment.
Figure 8:
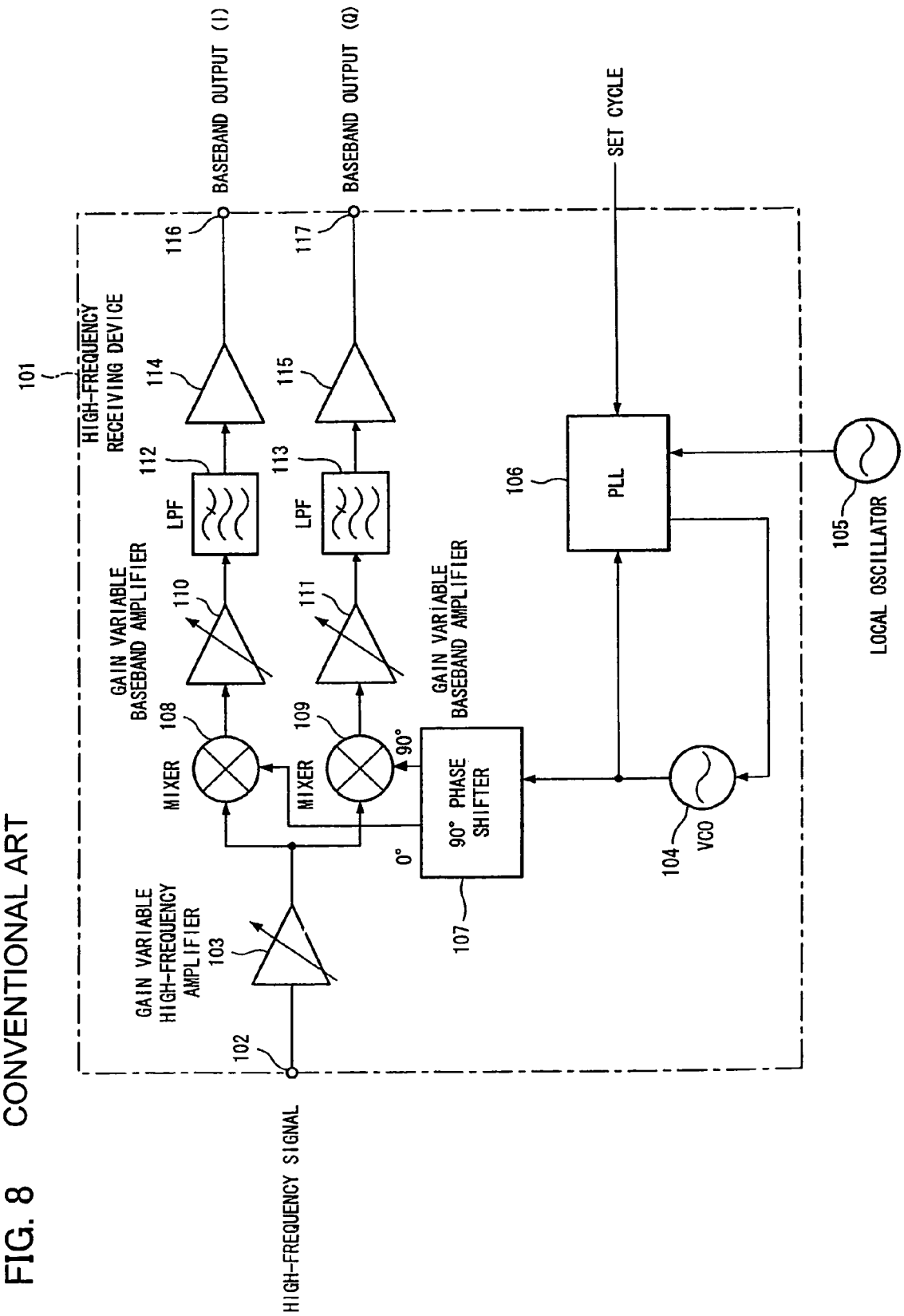
FIG. 8 is a circuit block diagram illustrating an example arrangement of a conventional high-frequency receiving device.
Figure 9:
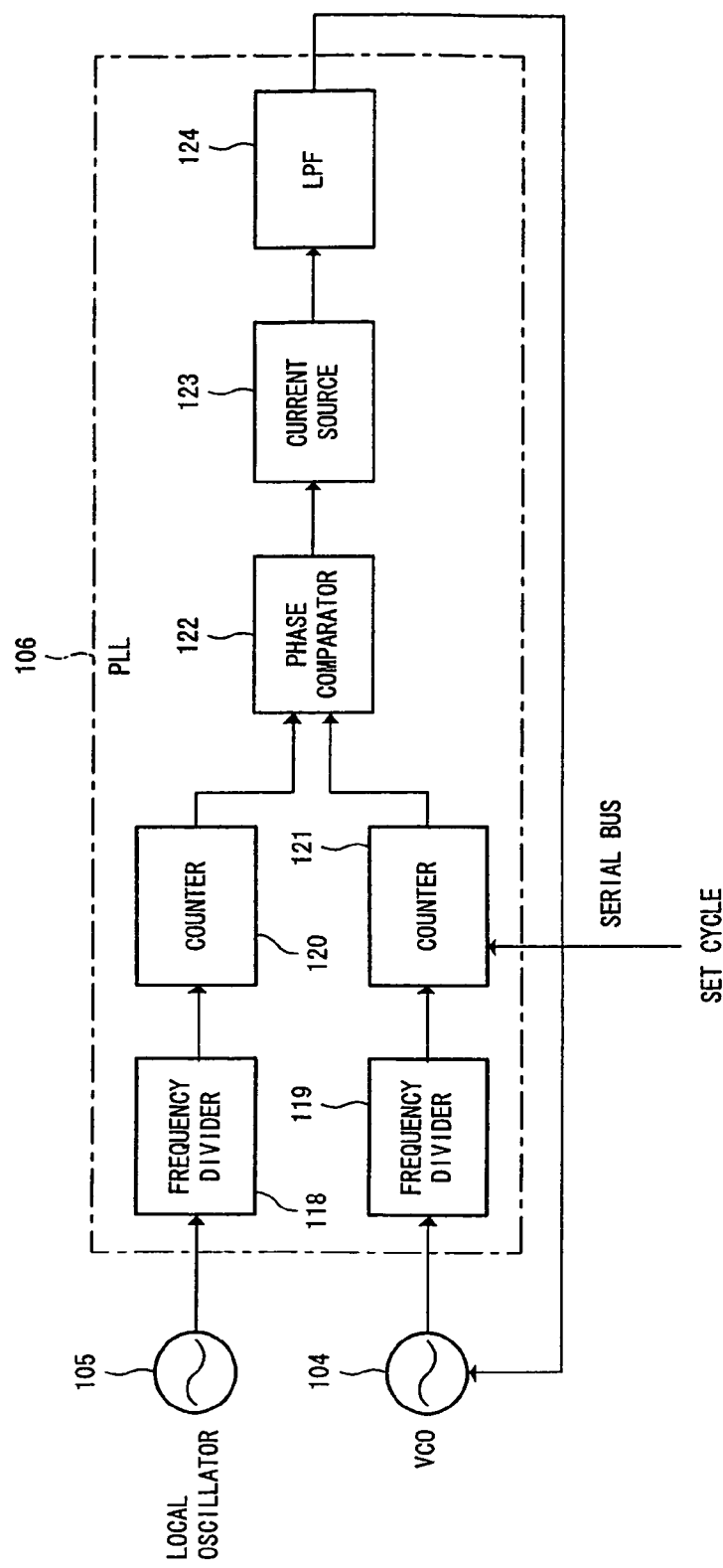
FIG. 9 is a circuit block diagram illustrating an example arrangement of a PLL circuit in the high-frequency receiving device of FIG. 8.
Figure 10:
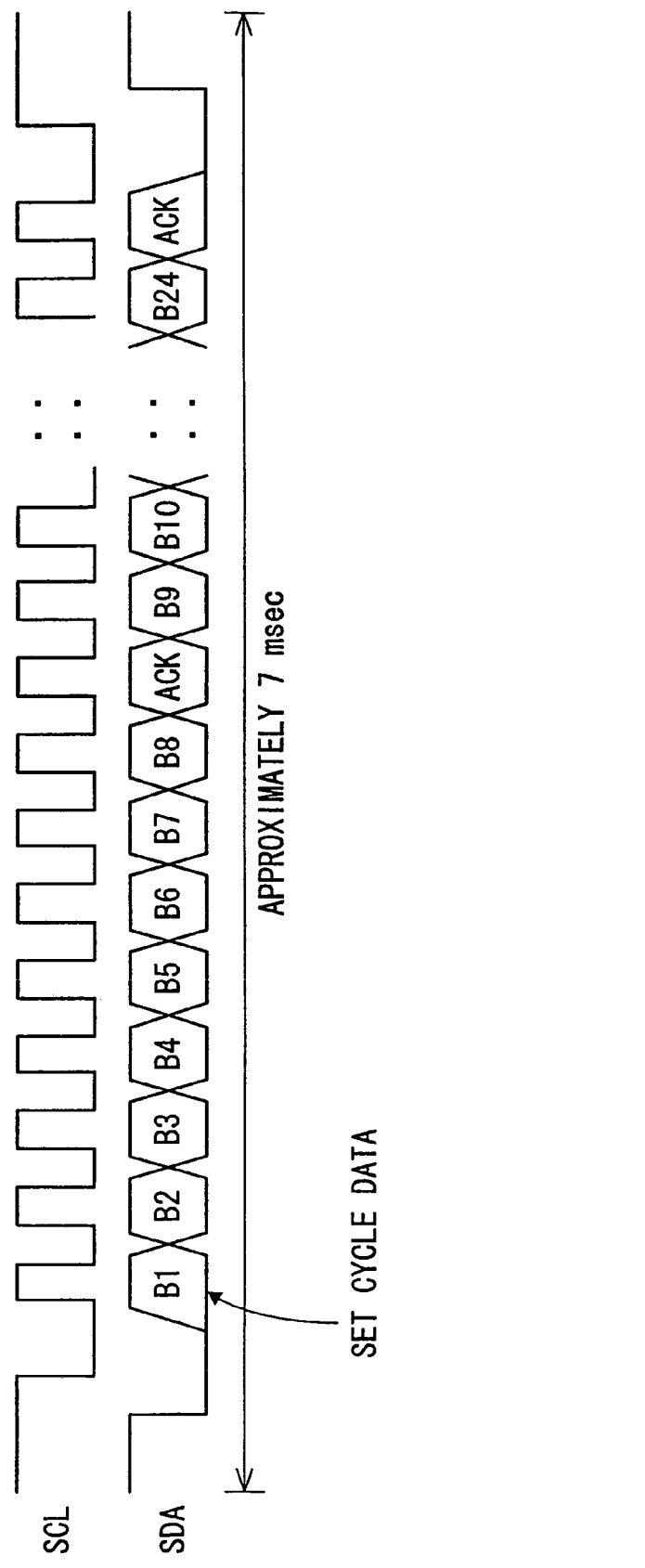
FIG. 10 illustrates a clock and cycle setting data transferred via a serial bus in the PLL circuit of FIG. 9.

FIG. 7 is a block diagram illustrating an arrangement of a high-frequency receiving device 1 according to the present embodiment.

The high-frequency receiving device 1 is a device which demodulates a high-frequency signal into I and Q quadrature baseband signals. The high-frequency receiving device 1 has a receiving input terminal 2, a gain variable high-frequency amplifier 3, a voltage-control local oscillator (VCO) 4, a local oscillator 5, a PLL circuit 6, a 90° phase shifter 7, mixer circuits 8 and 9, gain variable baseband amplifiers 10 and 11, low-pass filters 12 and 13, amplifiers 14 and 15, baseband output terminals 16 and 17, and a search circuit 18.

The receiving input terminal 2 is a terminal into which a high-frequency signal transmitted from a broadcasting station is inputted. The gain variable high-frequency amplifier 3 amplifies the high-frequency signal inputted from the receiving input terminal 2. The VCO 4, in order to convert a frequency of the high-frequency signal into a frequency of a baseband signal, outputs a local signal whose frequency is controlled by a control voltage. The local oscillator 5 is an oscillator which generates a frequency signal serving as a reference of the local signal.

The PLL circuit 6, based on the local oscillator 5, performs feedback control so that the local signal converges at a value in accordance with a set cycle. The PLL circuit 6 includes the PLL circuits 62 and 63 (FIGS. 3 and 5) of the Second and Third Embodiments.

The 90° phase shifter 7 generates a 90° phase-shifted signal and outputs the 90° phase-shifted signal and a 0° signal. The 90° phase-shifted signal is a signal whose phase is shifted by 90° from that of the output signal of the VCO 4. The 0° phase-shifted signal is a signal whose phase is not shifted at all from that of the output signal of the VCO 4.

The mixer circuits 8 and 9 perform frequency conversion of the high-frequency signal in order to detect I and Q quadrature baseband signals. The mixer circuit 8 demodulates the high-frequency signal into an I baseband signal by using the "0" signal outputted from the 90° phase shifter 7. The mixer circuit 9 demodulates the high-frequency signal into a Q baseband signal by using the 90° phase-shifted signal outputted from the 90° phase shifter 7. Each of the two mixer circuits 8 and 9 demodulates a received high-frequency signal into each quadrature baseband signal.

The gain variable baseband amplifier 10 amplifies an output of the mixer circuits 8, and the gain variable baseband amplifier 11 amplifies an output of the mixer circuits 9. The low-pass filter 12 blocks, from an output of the gain variable baseband amplifier 10, a frequency component out of a desired band, and the low-pass filter 13 blocks, from an output of the gain variable baseband amplifier 11, the frequency component out of the desired band.

The amplifier 14 amplifies an output of the low-pass filter 12, and the amplifier 15 amplifies an output of the low-pass filter 13. The baseband output terminal 16 outputs the I baseband signal amplified by the amplifier 14, and the baseband output terminal 17 outputs the Q baseband signal amplified by the amplifier 15.

The search circuit 18 is a circuit which searches a counter cycle necessary for reception. The search circuit 18 stores (writes), in the memory 29, a counter cycle detected as a result of search. The search circuit 18 detects a counter cycle whose baseband signal exceeds a predetermined level by sweeping a reception frequency (i.e., by sweeping a counter cycle) from an output of each of the amplifiers 14 and 15, the output being based on an actually set cycle of a counter 24. A sweeping method performed by the search circuit 18 uses an algorithm which gradually makes larger (or smaller) the set cycle of the counter 24. For this purpose, the search circuit 18 includes (i) a memory for storing a plurality of different set cycles, (ii) a comparator for judging whether a baseband signal exceeds a predetermined level or not, and (iii) a controller for reading out the set cycles sequentially from the memory 29 and writing, in the memory 29, a set cycle when the comparator judges the baseband signal to exceeds the predetermined level.

In the high-frequency receiving device 1 as arranged above, at a time of high-frequency reception, a sweep of a reception frequency is performed by the search circuit 18, so that any one of the searched set cycles is selected. At this time, when the swept reception frequency has a signal, a high-level signal appears in a baseband. Therefore, when the baseband exceeds a predetermined level, the reception frequency has a signal.

The search circuit 18 is thus provided, so that a set cycle value to be stored in the memory 29 can be adjusted to a channel which varies depending on a place of reception.

Further, by providing the PLL circuits 62 and 63 serving as the PLL circuit 6 in the high-frequency receiving device 1, time required in setting a cycle for the counter 24 is shortened. As a result, time required in reception can be shortened. This can be achieved also by providing the PLL circuit 61 (FIG. 1) of the First Embodiment serving as the PLL circuit 6 in the high-frequency receiving device 1. Note that, in such an arrangement, since a set cycle cannot be written in the memory 28, the search circuit 18 is not provided.

Recapitulation of the Embodiments

A PLL circuit includes: a counter, being programmable, which divides a frequency of an input signal; a memory for storing plural patterns of set cycles of the counter; a serial bus for transmitting, to the memory, data for selecting one of the set cycles stored in the memory; and a parallel bus for transmitting, to the counter, the set cycle read out from the memory based on the data.

In the foregoing arrangement, a set cycle having a large amount of data is supplied from the memory thorough the parallel bus to the counter. For this reason, it hardly takes time to set a cycle for the counter, and the setting time is not lengthened even when the number of bits of the counter increases. Furthermore, in case of using the PLL circuit for a high-frequency receiving device, even when data for selecting a set cycle is supplied to the memory through the serial bus in a region where a reception channel is determined, it will not take long time to set a cycle for the counter since the data is of a small amount.

It is preferable that the PLL circuit be arranged so that the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously based on the data, and the PLL circuit includes a frequency-dividing parallel bus through which the set frequency-dividing ratio read out from the memory based on the data is transmitted to the frequency divider.

There is a PLL circuit, used for a PLL frequency synthesizer or the like, which is arranged so that a frequency of a high-frequency local signal outputted from a local oscillator is divided by a frequency divider so as to lower the frequency to some extent, and the frequency is further divided by a counter. A memory stores a set frequency-dividing ratio of the frequency divider, and a frequency-dividing ratio of the frequency divider is set at that set frequency-dividing ratio, so that a frequency accuracy in the PLL circuit can be changed. Further, when the set frequency-dividing ratio and the set cycle are read out simultaneously from the memory through the frequency-dividing parallel bus, the setting time can be made shorter than when the set cycle and the set frequency-dividing ratio are set separately.

Alternatively, it is preferable that the PLL circuit or the preceding PLL circuit include: a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein: the memory stores plural patterns of the set current values in association with the set cycles and reading out one of the set current values and one of the set cycles simultaneously based on the data, and the PLL circuit includes a current parallel bus through which the set current value read out from the memory based on the data is transmitted to the current source.

Generally speaking, a PLL circuit compares a phase of an output of a counter with a phase of a reference signal, has a current source for outputting a signal (current) based on the comparison result, and converts the current into a voltage so as to obtain a control voltage for controlling an output frequency of a voltage-control oscillator (VCO). A memory stores a set current value and a current value of the current source is set at that set current value, so that shortening of a drawing time is preferentially performed or noise reduction is preferentially performed. Further, a frequency accuracy in the PLL circuit can be changed. Further, by reading out the set current value and the set cycle simultaneously from the memory through the current parallel bus, the setting time can be made shorter than when the set cycle and the current value are set separately.

Another PLL circuit includes: a counter, being programmable, which divides a frequency of an input signal; a memory for storing plural patterns of set cycles of the counter; an external setting line for transmitting the set cycles from outside; a selection circuit for selecting one of the set cycles read out from the memory or one of the set cycles from the external setting line; a serial bus for transmitting selection data to the selection circuit; and a parallel bus for transmitting, to the counter, the set cycle outputted from the selection circuit.

In the PLL circuit, unlike the preceding PLL circuit, the selection circuit selects and outputs either a set cycle read out from the memory or a set cycle transmitted from the external setting line. A set cycle having a large amount of data is supplied from the selection circuit through the parallel bus to the counter. For this reason, as with the preceding PLL circuit, it hardly takes time to set a cycle for the counter, and the setting time is not lengthened even when the number of bits of the counter increases. Further, since the external setting line and the selection circuit are provided, it is possible to select the more convenient one of a value from the external setting line and a value from the memory depending on a situation.

It is preferable that the PLL circuit be arranged so that the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously, and the external setting line transmits from outside the set frequency-dividing ratio in association with the set cycle, and the selection circuit selects and outputs one of the set frequency-dividing ratios from the memory or the external setting line, and the PLL circuit includes a frequency-dividing parallel bus through which the selection circuit transmits the set frequency-dividing ratio to the frequency divider.

Also in the PLL circuit, as with the preceding PLL circuit having the frequency divider, the memory stores a set frequency-dividing ratio of the frequency divider and sets a frequency-dividing ratio at that set frequency-diving ratio, so that a frequency accuracy can be changed. Further, a set frequency-dividing ratio read out from the memory at the same time as a set cycle or a set frequency-dividing ratio from the external setting line is transmitted through a frequency-dividing parallel bus to the frequency divider, so that the setting time can be made shorter than when a set cycle and a frequency-dividing ratio are set separately.

Alternatively, it is preferable that the PLL circuit or the preceding PLL circuit having the selection circuit include: a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein: the memory stores plural patterns of the set current values in association with the set cycles and reading out one of the set current values and one of the set cycles simultaneously, and the external setting line transmits from outside the set current value in association with the set cycle, and the selection circuit selects and outputs one of the set current values from the memory or the external setting line, and the PLL circuit includes a current parallel bus through which the set current value outputted from the selection circuit is transmitted to the current source.

Also in the PLL circuit, as with the preceding PLL circuit having the current source, the memory stores a set current value of the current source and a current value of the current source is set at that set current value, so that shortening of a drawing time is preferentially performed or noise reduction is preferentially performed. Further, a frequency accuracy in the PLL circuit can be changed. Further, a set current value read out from the memory at the same time as a set cycle or a set current value from the external setting line is transmitted through a current parallel bus to the current source, so that the setting time can be made shorter than when a set cycle and a current value are set separately.

In any one of the PLL circuits, it is preferable that the memory be writable, and the PLL circuit include a memory writing line for transmitting, to the memory, a set cycle to be written in the memory. In case of applying the PLL circuit to a high-frequency receiving device and, in particular, a digital television set, different channels are received in different places. For this reason, a set cycle to be stored in the memory is rewritten in advance by the memory writing line, so that a cycle can be set for the counter in accordance with a reception place.

In the PLL circuit, it is preferable that the memory writing line and the serial bus be combined to form a common communication line. This makes it possible to control the memory with an interface of the serial bus alone.

In any one of the PLL circuits each having the selection circuit, it is preferable that the external setting line and the serial bus be combined to form a common communication line. This makes it possible to control the memory with an interface of the serial bus alone.

A high-frequency receiving device has any one of the PLL circuits in order to set a reception frequency. This makes it possible to provide a high-frequency receiving device which requires short time in reception.

Further, another high-frequency receiving device has the PLL circuit whose memory is rewritable in order to set a reception frequency and has a detection circuit for detecting the set cycle necessary for reception, and the memory stores the set cycle so detected. This makes it possible to cause the detection circuit to detect in advance a set cycle in accordance with a channel which varies depending on a place of reception and cause the memory to store the set cycle, so that the set cycle necessary for the channel is set appropriately for the counter.

A PLL circuit of the present invention adopts an arrangement which shortens time required in setting a cycle for determining a frequency-dividing ratio of a counter for dividing a frequency of an output signal of a voltage-control local oscillator (VCO), so that time required in reception can be shortened. The PLL circuit of the present invention can be suitably used for a high-frequency receiving device for receiving digital television broadcasting.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A PLL circuit, comprising:
   a counter, being programmable, which divides a frequency of an input signal;
   a memory for storing plural patterns of set cycles of the counter;
   a serial bus for transmitting, to the memory, data for selecting one of the set cycles stored in the memory; and
   a parallel bus for transmitting, to the counter, the set cycle read out from the memory based on the data, wherein:
   the counter includes a frequency divider for dividing a frequency of an external signal at a frequency-dividing ratio chosen from a plurality of set frequency-dividing ratios in order to supply a signal for counting a number of pulses, and
   the memory stores plural patterns of the set frequency-dividing ratios in association with the set cycles and reads out one of the set frequency-dividing ratios and one of the set cycles simultaneously based on the data, and
   the PLL circuit includes a frequency-dividing parallel bus through which the set frequency-dividing ratio read out from the memory based on the data is transmitted to the frequency divider.

2. A PLL circuit, comprising:
   a counter, being programmable, which divides a frequency of an input signal;
   a memory for storing plural patterns of set cycles of the counter;
   a serial bus for transmitting, to the memory, data for selecting one of the set cycles stored in the memory;
   a parallel bus for transmitting, to the counter, the set cycle read out from the memory based on the data;
   a phase comparator for comparing a phase of an output of the counter with a phase of a reference signal so as to output a difference between the phases; and
   a current source for outputting a current in accordance with a phase difference output of the phase comparator at a current value chosen from a plurality of set current values, wherein:
   the memory stores plural patterns of the set current values in association with the set cycles and reads out one of the set current values and one of the set cycles simultaneously based on the data, and
   the PLL circuit includes a current parallel bus through which the set current value read out from the memory based on the data is transmitted to the current source.

3. The PLL circuit according to claim 1, comprising:
   a phase comparator for comparing a phase of an output of the counter with a phase of a reference signal so as to output a difference between the phases; and
   a current source for outputting a current in accordance with a phase difference output of the phase comparator at a current value chosen from a plurality of set current values, wherein:
   the memory stores plural patterns of the set current values in association with the set cycles and reads out one of the set current values and one of the set cycles simultaneously based on the data, and
   the PLL circuit includes a current parallel bus through which the set current value read out from the memory based on the data is transmitted to the current source.

4. The PLL circuit according to claim 1, wherein the memory is writable, and
   the PLL circuit includes a memory writing line for transmitting, to the memory, each set value to be written in the memory.

5. The PLL circuit according to claim 4, wherein the memory writing line and the serial bus are combined to form a common communication line.

6. A PLL circuit, comprising:
   a counter, being programmable, which divides a frequency of an input signal;
   a memory for storing plural patterns of set cycles of the counter;
   an external setting line for transmitting second set cycles from outside;
   a selection circuit for selecting one of the set cycles read out from the memory or one of the second set cycles from the external setting line;
   a serial bus for transmitting selection data to the selection circuit; and
   a parallel bus for transmitting, to the counter, the set cycle outputted from the selection circuit, wherein:
   the counter includes a frequency divider for dividing a frequency of an external signal at a frequency-dividing ratio chosen from a plurality of set frequency-dividing ratios in order to supply a signal for counting a number of pulses, and
   the memory stores plural patterns of the set frequency-dividing ratios in association with the set cycles and reads out one of the set frequency-dividing ratios and one of the set cycles simultaneously, and
   the external setting line transmits from outside second set frequency-dividing ratios in association with the second set cycles, and
   the selection circuit selects and outputs one of the set frequency-dividing ratios from the memory or one of the second set frequency-dividing ratios from the external setting line, and
   the PLL circuit includes a frequency-dividing parallel bus through which the selection circuit transmits the selected set frequency-dividing ratio to the frequency divider.

7. A PLL circuit, comprising:
   a counter, being programmable, which divides a frequency of an input signal;
   a memory for storing plural patterns of set cycles of the counter;
   an external setting line for transmitting second set cycles from outside;
   a selection circuit for selecting one of the set cycles read out from the memory or one of the second set cycles from the external setting line;
   a serial bus for transmitting selection data to the selection circuit;
   a parallel bus for transmitting, to the counter, the set cycle outputted from the selection circuit;
   a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously, and the external setting line transmits from outside second set current values in association with the second set cycles, and the selection circuit selects and outputs one of the set current values from the memory or one of the second set current values from the external setting line, and the PLL circuit further includes a current parallel bus through which the selected set current value outputted from the selection circuit is transmitted to the current source.

8. The PLL circuit according to claim 6, comprising:

a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously, and the external setting line transmits from outside the set current value in association with the set cycle, and the selection circuit selects and outputs one of the set current values from the memory or the external setting line, and the PLL circuit further includes a current parallel bus through which the set current value outputted from the selection circuit is transmitted to the current source.

9. The PLL circuit according to claim 6, wherein the memory is writable, and the PLL circuit includes a memory writing line for transmitting, to the memory, each set value to be written in the memory.

10. The PLL circuit according to claim 9, wherein the memory writing line and the serial bus are combined to form a common communication line.

11. The PLL circuit according to claim 6, wherein the external setting line and the serial bus are combined to form a common communication line.

12. The PLL circuit according to claim 7, wherein the external setting line and the serial bus are combined to form a common communication line.

13. A high-frequency receiving device comprising a PLL circuit for setting a reception frequency, the PLL circuit including:

a counter, being programmable, which divides a frequency of an input signal;

a memory for storing plural patterns of set cycles of the counter;

a serial bus for transmitting, to the memory, data for selecting one of the set cycles stored in the memory; and a parallel bus for transmitting, to the counter, the set cycle read out from the memory based on the data, wherein the PLL circuit is arranged so that:

the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously based on the data, and the PLL circuit includes a frequency-dividing parallel bus through which the set frequency-dividing ratio read out from the memory based on the data is transmitted to the frequency divider.

14. A high-frequency receiving device comprising a PLL circuit for setting a reception frequency, the PLL circuit including:

a counter, being programmable, which divides a frequency of an input signal;

a memory for storing plural patterns of set cycles of the counter;

a serial bus for transmitting, to the memory, data for selecting one of the set cycles stored in the memory; and a parallel bus for transmitting, to the counter, the set cycle read out from the memory based on the data;

a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously based on the data, and the PLL circuit includes a current parallel bus through which the set current value read out from the memory based on the data is transmitted to the current source.

15. The high-frequency receiving device according to claim 13, wherein the PLL circuit includes:

a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously based on the data, and the PLL circuit includes a current parallel bus through which the set current value read out from the memory based on the data is transmitted to the current source.

16. The high-frequency receiving device according to claim 13, wherein:

the memory is writable, and the PLL circuit includes a memory writing line for transmitting, to the memory, each set value to be written in the memory.

17. The high-frequency receiving device according to claim 16, wherein the memory writing line and the serial bus are combined to form a common communication line.

18. A high-frequency receiving device comprising a PLL circuit for setting a reception frequency, the PLL circuit including:

a counter, being programmable, which divides a frequency of an input signal;

a memory for storing plural patterns of set cycles of the counter;

an external setting line for transmitting second set cycles from outside;

a selection circuit for selecting one of the set cycles read out from the memory or one of the second set cycles from the external setting line;

a serial bus for transmitting selection data to the selection circuit; and a parallel bus for transmitting, to the counter, the set cycle outputted from the selection circuit, wherein the PLL circuit is arranged so that:

the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously, and the external setting line transmits from outside the set frequency-dividing ratio in association with the second set cycles, and the selection circuit selects and outputs one of the set frequency-dividing ratios from the memory or the external setting line, and the PLL circuit includes a frequency-dividing parallel bus through which the selection circuit transmits the selected set frequency-dividing ratio to the frequency divider.

19. A high-frequency receiving device comprising a PLL circuit for setting a reception frequency, the PLL circuit including:

a counter, being programmable, which divides a frequency of an input signal;

a memory for storing plural patterns of set cycles of the counter;

an external setting line for transmitting second set cycles from outside;

a selection circuit for selecting one of the set cycles read out from the memory or one of the second set cycles from the external setting line;

a serial bus for transmitting selection data to the selection circuit;

a parallel bus for transmitting, to the counter, the set cycle outputted from the selection circuit a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously, and the external setting line transmits from outside the set current value in association with the second set cycles, and the selection circuit selects and outputs one of the set current values from the memory or the external setting line, and the PLL circuit includes a current parallel bus through which the set current value outputted from the selection circuit is transmitted to the current source.

20. The high-frequency receiving device according to claim 18, wherein the PLL circuit includes:

a phase comparator for comparing a phase of an output of the counter with a phase of a reference signal so as to output a difference between the phases; and a current source for outputting a current in accordance with a phase difference output of the phase comparator at a current value chosen from a plurality of set current values, wherein:

the memory stores plural patterns of the set current values in association with the set cycles and reads out one of the set current values and one of the set cycles simultaneously, and the external setting line transmits from outside the set current value in association with the set cycle, and the selection circuit selects and outputs one of the set current values from the memory or the external setting line, and the PLL circuit includes a current parallel bus through which the set current value outputted from the selection circuit is transmitted to the current source.

21. The high-frequency receiving device according to claim 18, wherein:

the memory is writable, and the PLL circuit includes a memory writing line for transmitting, to the memory, each set value to be written in the memory.

22. The high-frequency receiving device according to claim 21, wherein the memory writing line and the serial bus are combined to form a common communication line.

23. The high-frequency receiving device according to claim 18, wherein the external setting line and the serial bus are combined to form a common communication line.

24. The high-frequency receiving device according to claim 19, wherein the external setting line and the serial bus are combined to form a common communication line.

25. A high-frequency receiving device comprising a PLL circuit for setting a reception frequency, the PLL circuit including:

a counter, being programmable, which divides a frequency of an input signal;

a memory, being writable, which stores plural patterns of set cycles of the counter;

a serial bus for transmitting, to the memory, data for selecting one of the set cycles stored in the memory;

a parallel bus for transmitting, to the counter, the set cycle read out from the memory based on the data; and a memory writing line for transmitting, to the memory, each set value to be written in the memory, the high-frequency receiving device further comprising a detection circuit for detecting, the set cycle necessary for reception, wherein the memory stores the set cycle so detected, wherein:

the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously based on the data, and the PLL circuit includes a frequency-dividing parallel bus through which the set frequency-dividing ratio read out from the memory based on the data is transmitted to the frequency divider.

26. A high-frequency receiving device comprising a PLL circuit for setting a reception frequency, the PLL circuit including:

a counter, being programmable, which divides a frequency of an input signal;

a memory, being writable, which stores plural patterns of set cycles of the counter;

an external setting line for transmitting the set cycles from outside;

a selection circuit for selecting one of the set cycles read out from the memory or one of the set cycles from the external setting line;

a serial bus for transmitting selection data to the selection circuit; and a parallel bus for transmitting, to the counter, the set cycle outputted from the selection circuit, the high-frequency receiving device further comprising a detection circuit for detecting the set cycle necessary for reception, wherein the memory stores the set cycle so detected, wherein:

the counter includes a frequency divider for dividing a frequency of an external signal at a frequency-dividing ratio chosen from a plurality of set frequency-dividing ratios in order to supply a signal for counting a number of pulses, and the memory stores plural patterns of the set frequency-dividing ratios in association with the set cycles and reads out one of the set frequency-dividing ratios and one of the set cycles simultaneously, and the external setting line transmits from outside the set frequency-dividing ratio in association with second set cycle, and the selection circuit selects and outputs one of the set frequency-dividing ratios from the memory or the external setting line, and the PLL circuit includes a frequency-dividing parallel bus through which the selection circuit transmits the selected set frequency-dividing ratio to the frequency divider.

27. The PLL circuit according to claim 1, further comprising: memory pre-storing the plural patterns of set cycles of the counter.

28. The PLL circuit according to claim 2, wherein:

the counter includes a frequency divider for dividing a frequency of an external signal at a frequency-dividing ratio chosen from a plurality of set frequency-dividing ratios in order to supply a signal for counting a number of pulses.

29. The PLL circuit according to claim 28, wherein:

the memory stores plural patterns of the set frequency-dividing ratios in association with the set cycles and reads out one of the set frequency-dividing ratios and one of the set cycles simultaneously based on the data.

30. The PLL circuit according to claim 25, wherein: the detection circuit detects the set cycle by sweeping a reception frequency from a received signal and stores the set cycle when the sweeped received signal exceeds a predetermined level.

31. The PLL circuit according to claim 26, wherein: the detection circuit detects the set cycle by sweeping a reception frequency from a received signal and stores the set cycle when the sweeped received signal exceeds a predetermined level.

* * * * *